(12) United States Patent
Lauffer et al.

(10) Patent No.: US 7,328,502 B2
(45) Date of Patent: Feb. 12, 2008

(54) APPARATUS FOR MAKING CIRCUITIZED SUBSTRATES IN A CONTINUOUS MANNER

(75) Inventors: John M. Lauffer, Waverly, NY (US); Voya R. Markovich, Endwell, NY (US); James W. Orband, Endicott, NY (US); William E. Wilson, Waverly, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/882,625

(22) Filed: Aug. 3, 2007

(65) Prior Publication Data
US 2007/0266555 A1 Nov. 22, 2007

Related U.S. Application Data

(62) Division of application No. 11/110,919, filed on Apr. 21, 2005.

(51) Int. Cl.
*B23P 19/00* (2006.01)

(52) U.S. Cl. .................. 29/738; 29/736; 29/825; 156/322

(58) Field of Classification Search .......... 29/736–738, 29/564.1–564.4, 825, 829, 852; 156/322–324, 156/330, 583.5, 275.1; 216/20, 33–36, 49, 216/56; 264/40.5, 40.7, 328.1; 425/110, 425/127, 449, 544
See application file for complete search history.

(56) References Cited

U.S. PATENT DOCUMENTS

| | | | |
|---|---|---|---|
| 4,372,800 A | 2/1983 | Oizumi et al. | |
| 4,557,784 A | 12/1985 | Uekita et al. | |
| 4,579,612 A | 4/1986 | Held | |
| 4,601,861 A * | 7/1986 | Pricone et al. | 264/1.6 |
| 4,659,425 A | 4/1987 | Eggers et al. | |
| 5,145,618 A * | 9/1992 | MacDonald et al. | 264/46.3 |
| 5,153,986 A | 10/1992 | Brauer et al. | |
| 5,976,391 A * | 11/1999 | Belke et al. | 216/13 |
| 6,015,520 A | 1/2000 | Appelt et al. | |
| 6,073,344 A | 6/2000 | Japp et al. | |
| 6,175,087 B1 | 1/2001 | Keesler et al. | |
| 6,188,027 B1 | 2/2001 | Miller et al. | |
| 6,204,453 B1 | 3/2001 | Fallon et al. | |
| 6,349,871 B1 | 2/2002 | Card, Jr. et al. | |
| 6,388,204 B1 | 5/2002 | Lauffer et al. | |
| 6,479,093 B2 | 11/2002 | Lauffer et al. | |
| 6,493,861 B1 | 12/2002 | Li et al. | |
| 6,495,239 B1 | 12/2002 | Bhatt et al. | |
| 6,500,349 B2 | 12/2002 | Andresakis et al. | |
| 6,521,844 B1 | 2/2003 | Fuerniss et al. | |
| 6,626,196 B2 | 9/2003 | Downes, Jr. et al. | |
| 6,628,531 B2 | 9/2003 | Dadafshar | |
| 6,630,630 B1 | 10/2003 | Maezawa et al. | |
| 6,630,743 B2 | 10/2003 | Magnuson et al. | |

(Continued)

*Primary Examiner*—Minh Trinh
(74) *Attorney, Agent, or Firm*—Hinman, Howard & Kattell, LLP; Lawrence R. Fraley

(57) ABSTRACT

Apparatus for making circuitized substrates using a continuous roll format in which layers of conductor and dielectric are fed into the apparatus, bonded, and passed on to other nearby work stations in which various processes such as hole formation, circuitization and, finally, segmentation occur. The resulting substrates can then be individually bonded to other, like substrates to form a larger multi-layered substrate with a plurality of conductive thru-holes, conductive and dielectric layers as part thereof.

10 Claims, 4 Drawing Sheets

U.S. PATENT DOCUMENTS

| | | |
|---|---|---|
| 6,631,558 B2 | 10/2003 | Burgess |
| 6,631,838 B2 | 10/2003 | Kim et al. |
| 6,638,690 B1 | 10/2003 | Meier et al. |
| 6,638,858 B2 | 10/2003 | Cheng |
| 6,750,405 B1 | 6/2004 | Fallon et al. |
| 7,134,193 B2 * | 11/2006 | Sasaoka et al. ............... 29/825 |

* cited by examiner

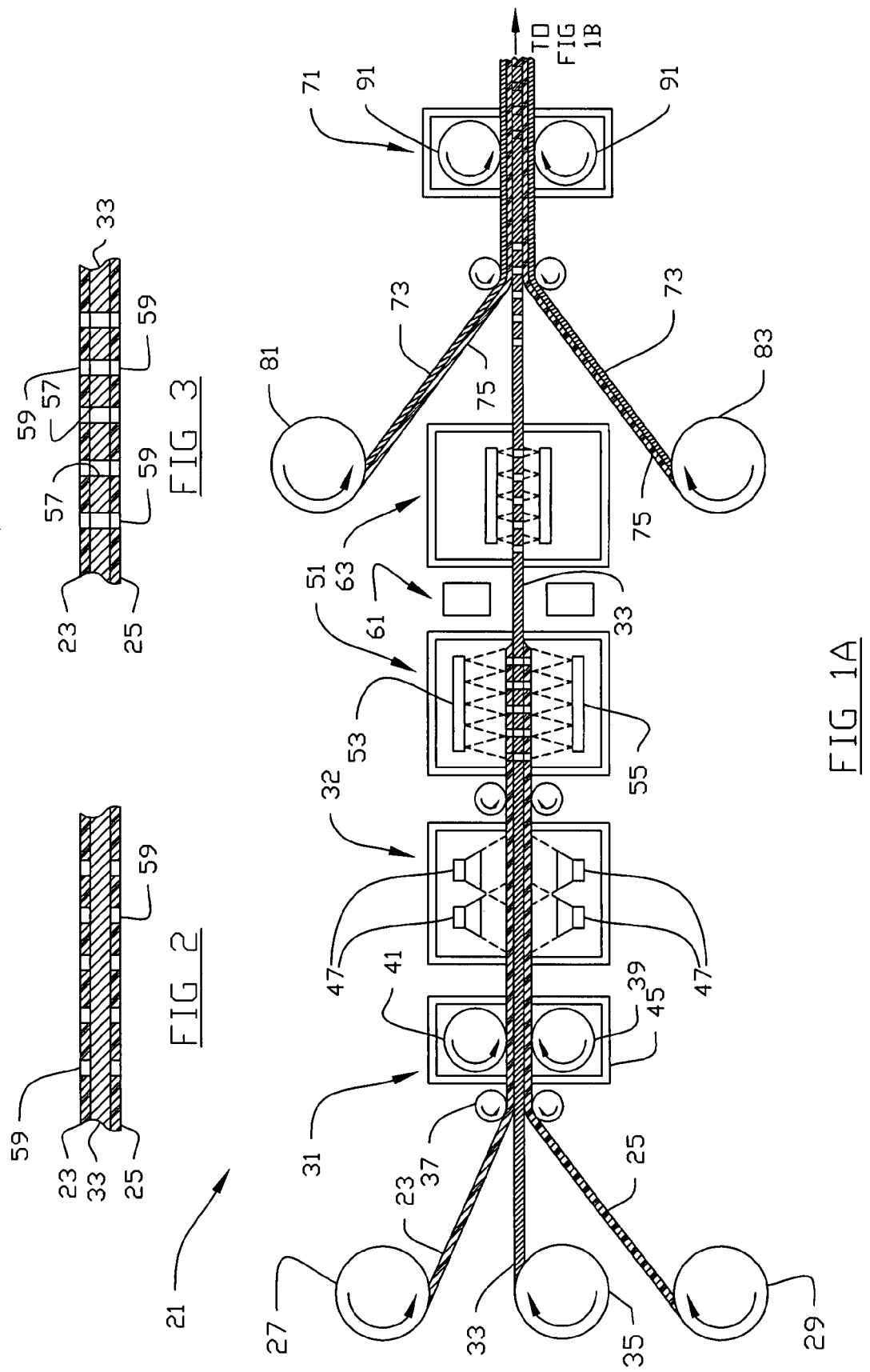

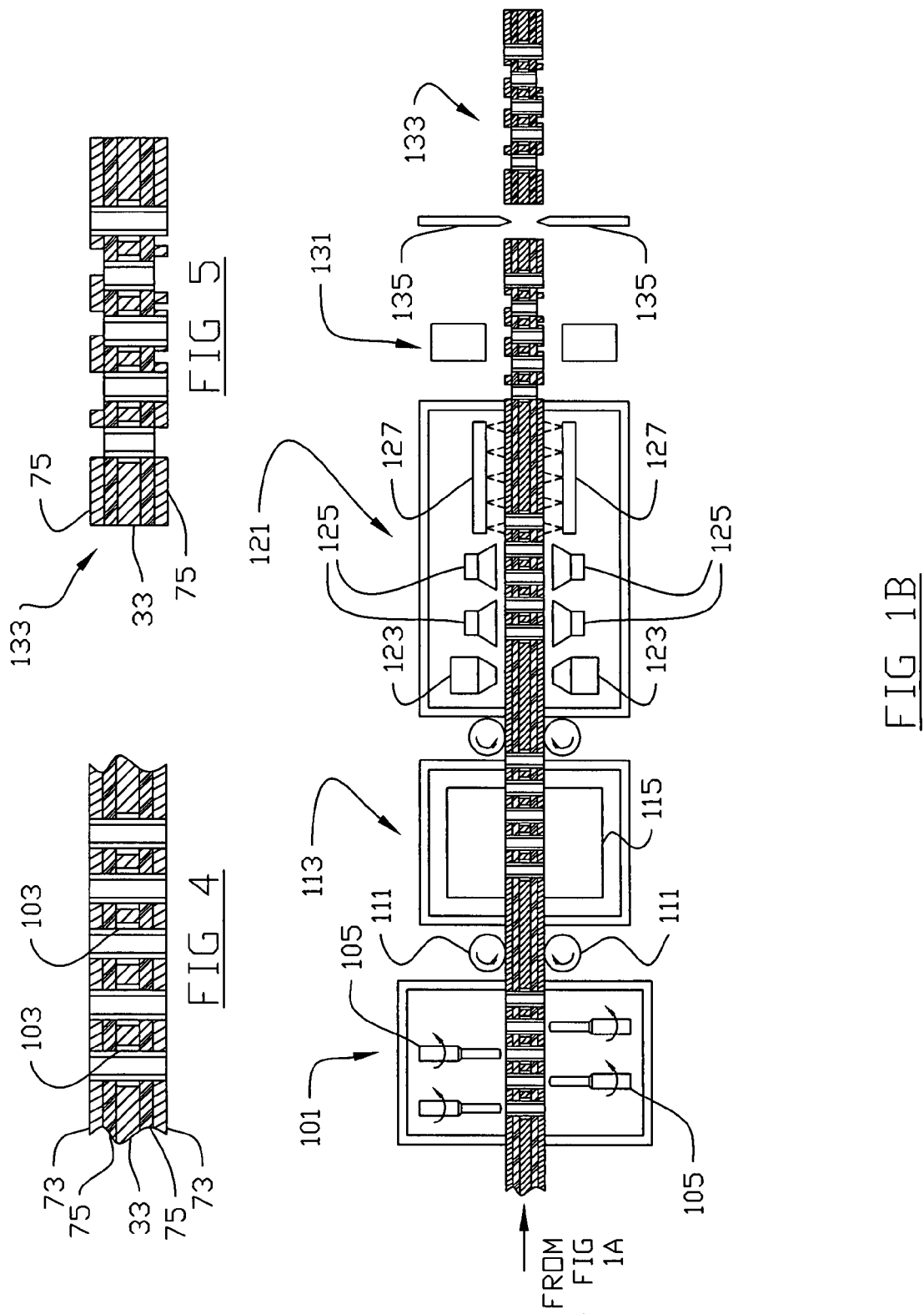

APPARATUS FOR MAKING CIRCUITIZED SUBSTRATES IN A CONTINUOUS MANNER

CROSS REFERENCE TO CO-PENDING APPLICATION

This application is a divisional application of Ser. No. 11/110,919, filed Apr. 21, 2005.

TECHNICAL FIELD

This invention relates to the manufacture of circuitized substrates such as printed circuit boards, chip carriers, and the like. The invention particularly relates to the manufacture of such substrates in which conductive thru-holes are provided therein.

BACKGROUND OF THE INVENTION

The conventional manufacture of circuitized substrates such as printed circuit boards and chip carriers, especially those of the multi-layered type, involves many individual processes such as etching, plating, lamination, drilling, testing, inspection, etc. Typically, these processes are performed at different locations within the manufacturing facility, requiring shipment of partially completed substrates from one station to another at such different locations. Such transfer is costly and time-consuming, especially when involving multi-layered products, the most common of boards sold today in view of increased operational demands for the products (e.g., computer servers, mainframes, etc.) in which such boards are implemented. In these boards, the board typically consists of parallel, planar, alternating inner layers of insulating substrate material and conductive metal. The exposed outer sides of the laminated structure are often provided with circuit patterns, as with double-sided boards, and the metal inner layer or layers typically contain circuit patterns, or, in the case of internal power planes, layers that are substantially solid. These latter layers also often include clearance openings or other openings if desired.

In multilayer printed circuit boards, it is necessary to provide conductive interconnections between the various conductive layers or sides of the board. This is commonly achieved by providing metallized, conductive thru holes in the board which communicate with the sides and layers requiring electrical interconnection. For some applications, it is desired that electrical connection be made between all or almost all of the conductive layers. It is often desired to also provide electrical connection between the circuitry on one face of the board and one or more of the inner circuit layers. In those cases, "blind vias", passing only part way through the board, are provided. In still another case, such multilayered boards often require internal "vias" which are located entirely within the board's structure and covered by external layering, including both dielectric and conductive. Such internal "vias" are typically formed within a sub-part structure of the final board and then combined with other layers during final lamination of the board. The term "conductive thru-hole" as used in the art may thus include both thru holes that pass entirely through the board (also referred to in the printed circuit field as plated thru holes or PTH's), "blind vias" which extend from an external surface of the board into a specified conductive layer of the board, as well as an "internal via" which is internally "captured" by the board's outer layers.

To provide the desired circuit pattern on the substrate, a variety of even more manufacturing processes are required, examples being those which fall into the broad categories of "subtractive" or "additive" techniques. Common to subtractive processing is the need to etch away (or subtract) metal to expose substrate surface in areas where no circuitry is desired. Additive processes, on the other hand, begin with exposed substrate surfaces (or thin commoning metallization layers for additive electroplate) and build up thereon of metallization in desired areas, the desired areas being those not masked by a previously-applied pattern of plating resist material (e.g., called photo-resist in the printed circuit board field). In conventional manufacture, such plating occurs in a separate department or location of the facility.

Typically, thru-holes are drilled (including mechanically or more recently using lasers) or punched into or through the substrate at desired locations. Drilling or punching provides newly-exposed interior surfaces including via barrel surfaces and via peripheral entry surfaces. The dielectric substrate, comprising a top surface, a bottom surface, and at least one exposed via hole surface, consisting partly or entirely of insulating material, is then metallized, generally by utilization of electroless metal depositing techniques, albeit other deposition processes are also known in the field. The formation of such thru-holes also typically occurs at a separate, different location within the manufacturing facility.

In the manufacture of circuitized substrates such as printed circuit boards, one or more dielectric sheets are employed for the substrate. These are typically of an organic material, such as fiberglass-reinforced epoxy resin (also referred to in the field as, simply, "FR4"), polytetrafluoroethylene (e.g., Teflon, a trademark of E.I. DuPont deNemours Company), Driclad material (Driclad is a trademark of the assignee of this invention, Endicott Interconnect Technologies, Inc.), etc. Since the dielectric substrate is nonconductive, in order to plate on the substrate, the substrate is typically "seeded" and one of the above two plating processes then occurs. Typically, these sheets are provided as individual, thin layers of rectangular shape and "stacked" with other layers, including conductive layers, to form the multi-layered final structure.

Still further manufacturing steps include the afore-mentioned inspection and testing operations. Often, inspections mandate the use of highly precise equipment such as programmed television cameras, in addition to manual inspection, while testing typically is accomplished with complex test apparatus requiring a skilled professional to operate. Both of these operations are also usually performed at different locations in the facility from other manufacturing operations such as defined above.

Examples of methods of making boards, including providing same with such thru holes, are shown and described in the following U.S. Letters Patents, as are examples of various types of boards produced by such methods:

6,015,520 Method For Filling Holes in Printed Wiring Boards
6,073,344 Laser Segmentation of Plated Through-Hole Sidewalls To Form Multiple Conductors
6,175,087 Composite Laminate Circuit Structure And Method Of Forming The Same
6,188,027 Protection of a Plated Through Hole From Chemical Attack
6,204,453 Two Signal One Power Plane Circuit Board
6,349,871 Process For Reworking Circuit Boards
6,388,204 Composite Laminate Circuit Structure And Methods Of Interconnecting The Same
6,479,093 Composite Laminate Circuit Structure And Methods Of Interconnecting The Same 6,493,861 Interconnected Series of Plated Through Hole Vias and Method of Fabrication Therefore
6,495,239 Dielectric Structure And Method Of Formation
6,521,844 Through Hole In A Photoimageable Dielectric Structure With Wired And Uncured Dielectric
6,626,196 Arrangement and Method For Degassing Small-High Aspect Ratio Drilled Holes Prior To Wet Chemical Processing
6,628,531 Multi-Layer and User-Configurable Micro-Printed Circuit Board
6,630,630 Multilayer Printed Wiring Board and Its Manufacturing Method
6,630,743 Copper Plated PTH Barrels and Methods For Fabricating
6,631,558 Blind Via Laser Drilling System
6,631,838 Method For Fabricating Printed Circuit Board
6,638,690 Method For Producing Multi-Layer Circuits
6,638,858 Hole Metal-Filling Method
6,750,405 Two Signal One Power Plane Circuit Board Various attempts have been made to manufacture at least some parts of circuit boards using what might be referred to as a continuous process. Examples of some of these processes are described below.

In U.S. Pat. No. 4,372,800, issued Feb. 8, 1983, there is described a "continuous" process for producing reinforced resin laminates comprising the steps of impregnating a fibrous substrate with a liquid resin (allegedly free of volatile solvent and capable of curing without generating liquid and gaseous by-products), laminating a plurality of the resin-impregnated substrates into a unitary member, sandwiching the laminate between a pair of covering sheets, and curing the laminate between said pair of covering sheets, without applying appreciable pressure. The patent discusses adjusting the final resin content in the resin impregnated substrate at 10 to 90% by weight, based on the total weight of the impregnated substrate.

In U.S. Pat. No. 4,557,784, issued Dec. 10, 1985, there is described a metal clad laminate produced in "continuous" manner by impregnating a plurality of fibrous substrate with a curable liquid resin, combining the plurality of substrates together and simultaneously laminating a metal foil onto at least one side of said substrates, and curing the laminate. This patent discusses the steps of applying an adhesive onto the metal foil to form a film and heating the film in situ continuously prior to step of the laminating of said metal foil.

In U.S. Pat. No. 4,579,612, issued Apr. 1, 1986, there is described the formation of an "electro-laminate" made of a core of insulating material webs with a high purity electrolytic copper foil on at least one side of the core, for use as a circuit board in electronic equipment. The web of insulating material and the copper foil are led from supply rolls to a laminating machine in out-of-contact relation. Prior to its introduction into the laminating machine, the copper foil is heated to the temperature of the laminating operation so that it is at its maximum thermally expanded length when it contacts the insulating material webs. Further, dust is removed from the copper foil as it enters the laminating machine. The webs and copper foil are moved at the same speed through the laminating machine. After pressing the electro-laminate in the laminating machine, it is moved through a cooling device. Subsequently, the electro-laminate can be wound in a roll or cut into individual lengths.

In U.S. Pat. No. 4,659,425, issued Apr. 21, 1987, there is described a "continuous" method wherein a coating of a solvent-free thermosetting resin is applied to the surface of a metal foil. This resin-coated foil is advanced into contact with a reinforcing cloth sheet layer to form a foil/cloth assembly. The assembly is continuously conveyed between a pair of endless belts revolving in opposite directions with mutually facing surfaces, the belts being heated to the curing temperature of the resin whereby the belts are pressed against the assembly to continuously compact the assembly and cure the resin to form a composite product which can then be circuitized. This partial process does not include many of the essential steps such as defined above which are necessary for boards of more complex construction, especially those needing conductive thru-holes as part thereof.

In U.S. Pat. No. 5,153,986, issued Oct. 13, 1992, there is described a method of fabricating a multilayer electronic circuit package. The multilayer circuit package has at least one layer that is a circuitized, polymer encapsulated metal core. According to the method of the invention a metal foil is provided for the metal core of the layer. This metal core foil may be provided as a single unit or in a roll to roll, process. The thru holes are drilled, etched, or punched through the metal foil. An adhesion promoter is then applied to the perforate metal foil for subsequent adhesion of polymer to the foil. The dielectric polymer is then applied to the perforate metal foil core by vapor depositing, chemical vapor depositing, spraying or electrophoretically depositing, a thermally processable dielectric polymer or precursor thereof onto exposed surfaces of the perforate metal foil including the walls of the thru holes. The dielectric polymer or precursor thereof is then thermally processed to form a conformal dielectric, polymeric coating on surfaces of the perforate metal foil, including the interior surfaces of the thru holes. This dielectric, polymeric coating may then be circuitized, and coated with an adhesive for lamination to the next adjacent layer. After lamination, one or more chips are attached to the completed package.

In U.S. Pat. No. 6,500,349, issued Dec. 31, 2002, there is described a "continuous" process for forming multilayer circuit structures which includes applying and curing a film forming polymer onto the matte side of a copper foil. The opposite (shiny) side of the foil is cleaned, and applied with a photoresist which is then dried. The photo-resist is exposed, and developed to remove the non-image areas, while leaving the image areas. The foil under the removed non-image area is then etched to form a copper pattern, and the remaining photo-resist is removed. The foil is then cut into sections, and then punched with registration holes. The copper pattern is then treated with a bond enhancing treatment, inspected for defects, and laminated onto a substrate to form a multilayered circuit structure.

The present invention represents a new and unique apparatus for forming circuitized substrates having conductive thru holes therein. Significantly, the apparatus as defined herein is capable of making a circuitized substrate beginning from providing layers of conductor and dielectric material on through circuitizing, all on a continuous format, and then segmenting the circuitized elements to produce individual substrates. Such substrates can then be bonded, e.g., laminated, to other similar substrates to form a larger, multi-layered structure. It is believed that such an apparatus will represent a significant advancement in the art.

OBJECTS AND SUMMARY OF THE INVENTION

It is, therefore, a primary object of the present invention to enhance the circuitized substrate art by providing a new and unique apparatus for producing such substrates.

It is another object of the invention to provide such an apparatus in which several conductive thru holes are formed to interconnect various conductive layers of the substrate.

It is still another object of the invention to provide such an apparatus which may implement some conventional printed circuit board production structures.

According to one aspect of the invention, there is provided an apparatus for making a plurality of circuitized substrates, the apparatus comprising a first feed device for feeding a first conductive layer having first and second opposing surfaces, second and third feed devices for feeding first and second dielectric layers, a bonding device for bonding the first and second dielectric layers to the first and second opposing surfaces of the first conductive layer, respectively, to form a continuous, bonded structure, a hole-forming device for forming holes within the continuous, bonded structure in a plurality of patterns such that the holes extend entirely through the thickness of the structure, a metal depositing device for depositing electrically conductive material within the holes, and a segmenting device for segmenting the continuous bonded structure to define a plurality of circuitized substrates each having a respective one of the patterns of holes therein, all of these devices performing the above respective processes while the first conductive layer is in the form of a continuous, solid member.

BRIEF DESCRIPTION OF THE DRAWINGS

FIGS. 1A and 1B illustrate an apparatus for forming a circuitized substrate in a continuous format according to one aspect of the invention, the apparatus also illustrating the steps of making such a substrate;

FIGS. 2-5 illustrate enlarged, partial views of various parts of the continuously formed circuitized substrate during the method of manufacture thereof using the apparatus in FIGS. 1A and B;

BEST MODE FOR CARRYING OUT THE INVENTION

Figure 6:
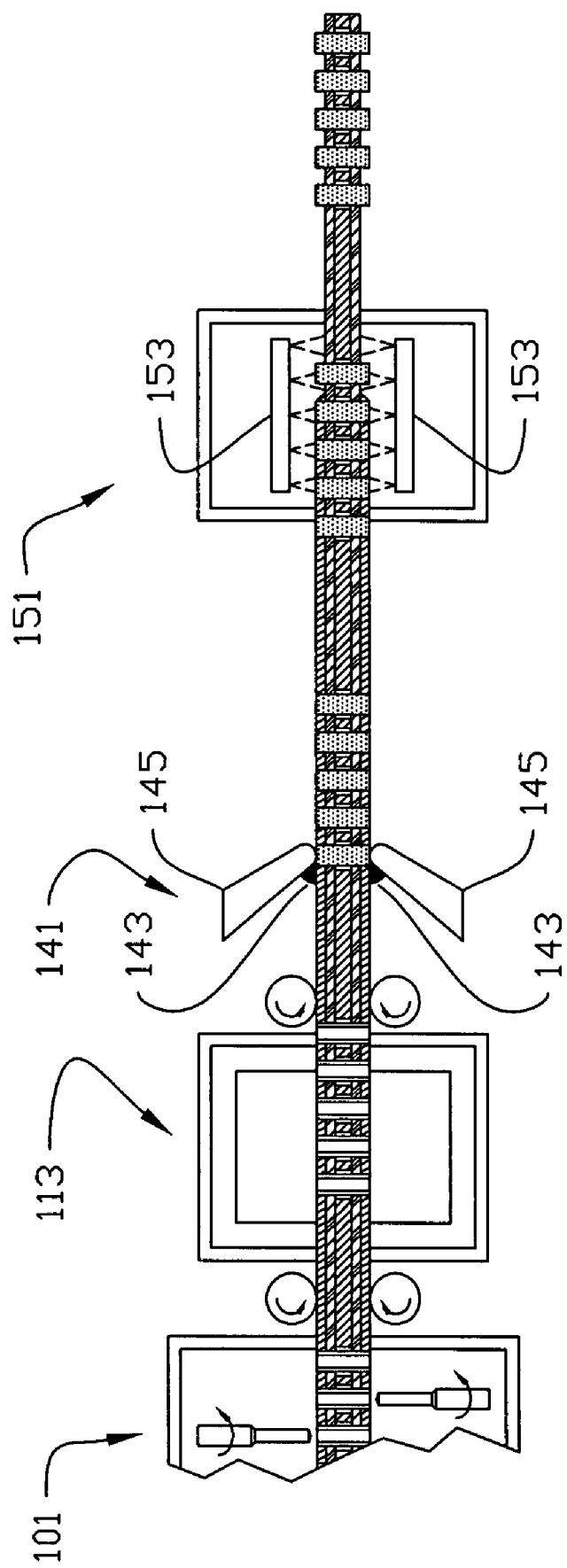
FIG. 6 is a partial view illustrating an apparatus for making a circuitized substrate according to an alternative embodiment of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "continuous" as used herein when defining a process is meant a process in which all of the steps to manufacture a circuitized substrate having at least one conductive layer and two dielectric layers are performed with the at least one conductive layer being in the form of a continuous layer, up to final segmenting to define the final substrate's dimensions. All steps are performed while the conductive layer remains as provided from its original source (e.g., a roll), without segmenting occurring until the last step.

By the term "circuitized substrate" as used herein is meant to include substrates having at least two (and preferably more) dielectric layers and at least one (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, etc. The dielectric layers taught herein may be typically about 2 mils to about 4 mils thick, but also thicker or thinner if desired. Examples of circuitized substrates include printed circuit boards (or cards) and chip carriers. It is believed that the teachings of the instant invention are also applicable to what are known as "flex" circuits (which use dielectric materials such as polyimide).

In FIGS. 1A-1B, there is shown an apparatus 21 for making a circuitized substrate according to one aspect of this invention. As indicated herein, apparatus 21 is able to make this substrate in a continuous manner, meaning that at least one conductive layer of the final substrate remains in the form of a continuous, substantially solid member (excluding the provision of holes therein as described) throughout the entire processing thereof, up to the final segmenting step when individual substrates are removed from the continuous line. One of the most significant features of this invention is the ability to bond various layers of the substrate together while also forming large numbers of high density patterns of holes within the substrate line in patterns associated with each of the final substrates being produced. This combination of processes is attainable while also performing other, individual processes such as etching, exposure, testing, and the like as needed.

In FIG. 1A, first and second dielectric layers 23 and 25 are provided from individual roll members 27 and 29, respectively, to a first bonding station 31. As part of this feeding operation, a conductive layer 33 is also fed, also from a roll member 35 such that it will be sandwiched between the upper and lower dielectric layers 23 and 25. Preferably, these three layers are provided to a first set of feed rollers 37 which draw the layers together and feed these into the bonding station 31. In a preferred embodiment, the bonding station 31 includes at least one pair of opposed, heated rollers 39 and 41. Each of these rollers is preferably heated to a predetermined temperature (in one embodiment, to a range of from about 75 degrees to about 130 degrees Celsius (C.)) and are comprised of rubber coated steel cores. Various means may be utilized to heat the rollers 39 and 41, the preferred means being electrical resistive heaters contained within the steel core of the roller. Each of the rollers 39 and 41 are shown as being positioned within a housing 45, but this is not a necessary requirement. The rollers exert a force within the range of from about 10 pounds per square inch (p.s.i.) to about 80 p.s.i. on the three layers as these pass there-through. As a result, each of the outer dielectric layers 23 and 25 is firmly bonded to the interim, common conductive layer 33.

In a preferred embodiment, each of the dielectric layers is comprised of a conventional dry film photo-resist, a preferred example being Riston EtchMaster photo-resist, available from E. I. DuPont de Nemours and Company, having an office in Research Triangle Park, N.C., USA. Each layer preferably possesses a thickness within the range of from about 0.6 mils to about 2.0 mils. The corresponding interim conductive layer is preferably copper and has a thickness of from about 0.5 mils to about 3 mils. Significantly, this conductive layer will remain as a solid, integral member through-out the entire method defined herein, up to the final severance of it and associated dielectric and conductive layers (if any) from the continuous format shown.

Once compression (lamination) of the three layers has occurred, a bonded structure now results and is now passed on to the next station 32. At station 32, the bonded structure comprised of these three layers (with the dielectric forming the outer layers) is subjected to an exposure step in which the photo-resist material is exposed to define a specific hole pattern therein. These holes are to eventually define the pattern of the clearance holes within the interim copper layer, such clearance holes necessary to allow connection through the conductive layer if desired. It is necessary to define the hole patterns in the outer photo-resist layers to define the copper layer's pattern, as the photo-resist is primarily used for this purpose and will be eventually discarded (stripped away). The exposure operation conducted at station 32 is performed using known exposure lamps, shown by the numerals 47, it being understood that various masking structure (not shown) is also required and well within the knowledge of one skilled in the art.

Following the exposure, the composite structure is moved to station 51 in which development of the photo-resist, etching of the clearance holes within the composite and removal of the photo-resist is performed. Development is accomplished using a conventional developer known in photolithographic processing, the developer deposited on the external surface and thus serving to remove the corresponding portions of the photoresist material and expose the desired clearance hole locations thereunder. During the etch procedure, a conventional etchant (preferably cupric chloride) is sprayed onto the composite using spray devices 53 and 55. The structure so formed is partially illustrated in FIG. 3, wherein the holes 57 formed are better seen. The corresponding photoresist 23 and 25, having the developed (removed) holes 59 is also shown. Of further notation, FIG. 2 illustrates the structure of the composite following the photoresist material removal to define these openings 59 and prior to the etching to form the holes 57.

Although etching is defined as the means of providing clearance holes 57, the invention is not limited thereto in that other procedures, including mechanical or laser drilling and punching are possible, these methods not requiring the use of photo-resist layers 23 and 25.

Following this, the conductive layer 33 is further advanced to optical test device 61 in which highly precise television cameras inspect the formed apertures, now found only within the common conductive layer 33. As part of the aforementioned develop and etch process, the outer dielectric layers 23 and 25 have been entirely removed (stripped) from the copper conductive layer such that only the copper layer is now advanced. Following optical inspection, the conductive layer 33 is continuously advanced to the next station 63 during which an adhesion treatment procedure is performed. This optional procedure is utilized to prepare the outer surface of the copper layer for subsequent bonding to the subsequent dielectric and conductive layers being applied. In a preferred embodiment, this treatment at station 63 involves the exposure of these surfaces to an oxide material (e.g. sodium chlorite, typically used in combination with other chemicals) or to what is known as a BondFilm process, currently available on the marketplace under this name from Atotech Deutschland GmbH, an international company having a U.S.A. business address at 1750 Overview Drive, Rock Hill, S.C., in which a known material is applied and the exterior surfaces roughened to a desired extent necessary to enhance the subsequent bonding. During this procedure, the copper layer is exposed to the treatment material for a period of from about 5 seconds to about 2 minutes while the material is at a temperature of from about 20 degrees Celsius (C) to about 40 degrees C. The treated conductive layer 33 is then passed to a second bonding station 71 in which two pairs of dielectric and conductive layers are bonded on opposite sides thereof. Each pair is comprised of a thin conductive layer 73, preferably a copper layer having a thickness of from about 0.2 mil to about 1.0 mil. The remaining layer of the pair comprises a dielectric layer 75, preferably of one of the dielectric materials described above, and more preferably, DriClad pre-preg or Resin Coated Copper (RCC). (DriClad is a known dielectric material used by the Assignee of this invention to manufacture substrate products.) This dielectric layer preferably possesses a thickness of from about 1.5 mils to about 5 mils. Each of these pairs preferably comprises similar materials for the conductor and dielectric but this is not meant to limit the invention in that different dielectrics may be applied on opposite sides of the common conductive layer 33, as it is also possible to provide different conductive layers than copper, e.g., aluminum. Each of the pairs of dielectric and conductive layers is provided from a roller 81 and 83, respectively.

The structure is now a five-layered structure and fed from feed rollers to station 71 in which a second pair of heated rollers 91 is utilized to fixedly bond the dielectric layer 75 to the interim copper layer 33. Preferably, these heated rollers 91 are similar to rollers 39 and 41 at station 31, except these rollers are preferably heated to a predetermined temperature (in one embodiment, to a range of from about 130 degrees to about 250 degrees C.) and are preferably comprised of solid steel cores. The rollers exert a force within the range of from about 100 p.s.i. to about 500 p.s.i. on the layers as these pass there-through. As a result, each of the outer dielectric layers 75 is firmly bonded to the interim, common conductive layer 33. Alternatively, dielectric 75 may comprise a film material, in which case conductor layers 73 may or may not be required. Further, dielectric 75 could be applied to conductor 33 in a liquid form, in which case rollers 91 would be coating rolls or other similar coating device.

Although it is shown in FIGS. 1A and 1B to apply only one pair of conductive and dielectric layers to the opposite sides of copper layer 33, the invention is not so limited. Specifically, it is also within the scope of this invention to add additional pairs of dielectric and conductive layers at subsequent stations, depending on the operational requirements of the end product. If the case, the initial pairs shown at station 71 will be processed as defined (to form the desired circuit pattern within the conductive layer of the two) and a second pair of conductive and dielectric layers will then be applied, using a similar structure as shown at station 71, including similar supply rollers as rollers 81 and 83. This second pair will be similarly processed to form the desired patterns in the conductive layers following bonding thereof to the first pair, respectively. Subsequent pairs may also be provided and bonded. The apparatus to perform such feed and bond steps is preferably similar to that shown for layers 73 and 75, and is thus not shown for expedience purposes. Such adding of more pairs would occur immediately subsequent station 121, followed by a station 121 for each pattern formation desired (or pair added to both sides). The thru-holes formed at station 101 would then be provided through the complete several layered structure, the initial grouping provided in the three layered structure at station 101 not being provided until this final phase. That is, the thru holes which extend entirely through the multi-layered structure will not be provided until all dielectric and conductive layers are bonded and circuitized. Only one hole formation process for such entire thru-holes is thus necessary (or desired).

The next step in the operation, as indicated above, represents a significant one and this is performed at the aforementioned station 101. Here, holes (referenced by the numeral 103 in enlarged FIG. 4) are provided through the entire thickness of the five layered, bonded structure passing from station 71. (Again, it is noted that this hole formation will occur here only for a five layered embodiment as shown, but will be performed later if more dielectric-conductive layer pairs are utilized.) Significantly, these holes are formed in a pattern identical to that of the internal clearance holes provided within conductive layer 33, it thus being understood that precision is essential. In a preferred embodiment, these holes are provided using mechanical drills, punching apparatus or by laser ablation. In a more preferred embodiment, an UV-YAG laser is utilized, albeit the station 101 in FIG. 1B illustrates the aforementioned mechanical drills 105. In order to accomplish this precise drilling, the line including these bonded layers is stopped for a predetermined time period of from about 30 seconds to about 30 minutes. So as not to impact processing either before or after drilling, accumulators, not shown in drawing, are utilized before and after this operation, as well as before and after other operations which may require stoppage of the web (e.g. expose tool 32). Such accumulators (e.g., in one example, several take-up rollers) are known for continuous web processing and further description or illustration is not deemed essential. In one example, a total of 10,000 holes may be provided at station 101, each of these holes including a diameter of only from about 2 mils to about 6 mils, and provided at spacings from one another as little as 10 mils. It is to be understood that one of the most important aspects of this invention is the ability to provide such large numbers of holes in such close patterns all in a continuous process in which other important steps are also being performed.

Following the hole formation, the apertured structure is moved by advance rollers 111 to the next station 113 during which the holes are seeded with a conventional seed material known in the art (e.g., one example being a solution of stannous chloride and palladium chloride) to initiate subsequent metal application. Following seed, the holes are flash plated using an electro-less copper plating solution. Plating may continue with a full build electro-less copper plating or may switch to electrolytic copper plating. The plating device is represented in FIG. 1B by the numeral 115.

Following plating, the composite structure is advanced to the next station, 121, during which the final outer circuit patterns will be defined within the external conductive layers 73. In a preferred embodiment, this is accomplished using a known photolithographic process in which a second photoresist is supplied (i.e., using nozzles 123), followed by exposure (i.e., using lamps 125), and subsequent development and etch (i.e., using etching apparatus 127). The preferred photoresist and etchants are the same as used at stations 32 and 51 described above. Following this operation, a final optical test, again using precise television cameras, is performed at station 131.

Finally, the respective circuitized substrates, represented by the numeral 133 and also seen in larger detail in FIG. 5, are separated (preferably using a sheering device in which opposing blades 135 are used). In one example, each of the circuitized substrates possesses a width of about 18 inches and a length of about 24 inches. Each includes the described common interim conductive layer 33, having its clearance holes therein such that the thru-holes as plated in station 113 are used and which are electrically isolated from the clearance holes to interconnect the opposite, formed circuit patterns now within the outer conductive layers 75.

It is understood that one of the unique teachings of the present invention is the ability to not only provide several similar circuitized substrates 133, each having the same hole pattern and conductive circuit patterns on the exterior surfaces thereof, but also to provide circuitized substrates with different clearance holes and external circuit patterns thereon. This is accomplished by appropriate software to coordinate the respective hole-forming operations at station 101 and the circuit pattern forming steps at station 121.

In FIG. 6, there is shown an alternative embodiment of making circuitized substrates in accordance with the teachings of this invention. In FIG. 6, the composite structure as passed through station 101 (only partly shown) passes to the described station 113 in which these holes formed within the structure are now cleaned of any internal contaminants, but not provided with internal plating as occurred in FIG. 1B. It is understood that this contaminant removal is also a preferred step in the structure as produced in above FIG. 1B. In FIG. 6, the composite, five-layered structure is passed to a structure 141 designed to deposit electrically conductive paste 143 within the cleaned, provided holes in the composite. In a preferred embodiment, this paste is provided using a conventional squeegee, as represented by the numerals 145, and applied from opposite surfaces of the structure as shown. In a preferred embodiment, the conductive paste as deposited may be a silver, copper, gold or tin filled polymer such as that available from National Starch and Chemical Company under the product name Ablestick 8175 or that provided by E.I. duPont deNemours & Company under product name CB100. This may also be an organometallic paste such as Ormelink paste available from Ormet Circuits, Inc., having a business location in Carlsbad, Calif.

Although the structure removed from station 113 includes holes that are clear of contaminants, it is also within the scope of the invention to seed and plate these holes prior to the deposition of the defined electrically conductive paste. Should this be desired, the same metals as described above with respect to station 113 are provided, preferably at the thicknesses defined.

Following paste deposition, the five-layered composite is moved next to station 151, at which it is desired to remove all of the external copper layer material 75. This is preferably achieved using an etchant (similar to that above) using etching devices 153. The subsequent, three-layered structure is then further advanced to the sheering operation in much the same manner as described for the five-layered composite structure in FIG. 1B.

Figure 7:
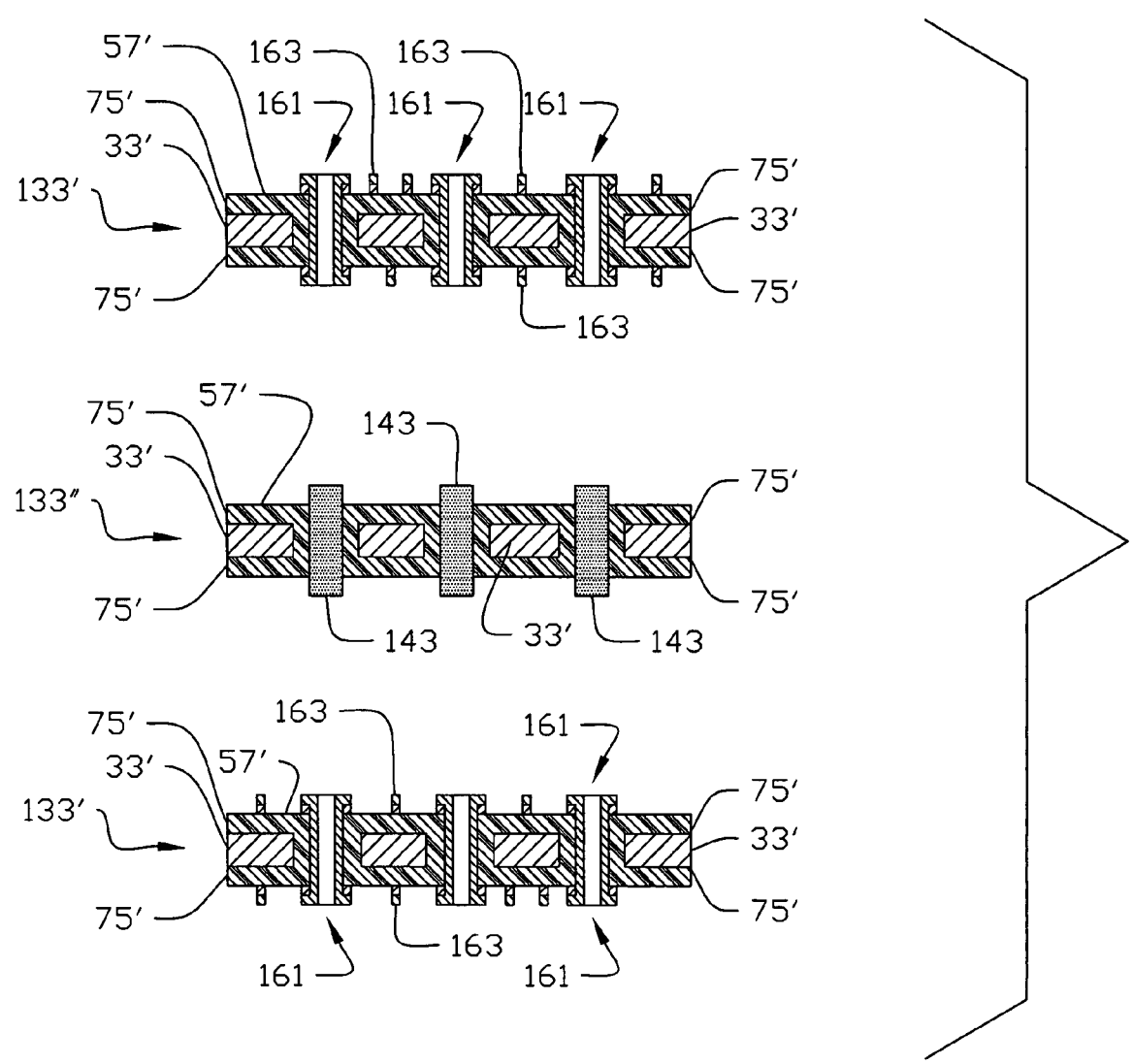
FIG. 7 is an exploded view, on a much enlarged scale over the above FIGS., illustrating the step of bonding various circuitized substrates formed using the apparatus and method taught herein together to form a larger, multi-layered circuitized substrate.

FIG. 7 represents much enlarged examples of the circuitized substrates which can be produced using the teachings of this invention. In FIG. 7, the upper and lower substrates 133' are similar to those provided using the apparatus in FIG. 1B. Specifically, each includes a common conductive layer 33' having the defined clearance openings 57' therein. Each further includes the outer dielectric layers 75', in addition to the thru-holes 161. It is noted that in FIG. 7, each of these circuitized substrates 133' includes two conductive layers on the outer surfaces thereof. This may be accomplished using the teachings of the invention by providing a second conductive layer atop the already defined conductive patterns as produced, for example, from the station 121 in FIG. 1B. That is, only partial removal of the copper outer layer having the defined pattern is provided. As further seen in FIG. 7, each of these external circuit patterns also include individual conductive elements 163 which may, in the final structure, serve as signal lines.

Also seen in FIG. 7 is an example of the circuitized substrate, represented by the numeral 133" as produced from the embodiment shown in FIG. 6. This structure also includes the common conductive layer 33' and its corresponding clearance holes 57, as well as the external dielectric layers 75 and 75'. However, the circuitized substrate 133" in FIG. 7 does not include the above-defined external conductive patterns thereon but instead only includes a series of holes having the described conductive paste 143 therein.

In FIG. 7, the three illustrated circuitized substrates are aligned in the manner shown such that the conductive paste as shown aligns with corresponding opposing pairs of thru-holes. The composite structure is then laminated using conventional lamination processing and a composite structure formed, of a multi-layered configuration having the defined seven conductive layers therein with respective conductive layers being coupled through the interim circuitized substrate 133" by the conductive paste. In one example, the lamination procedure to bond these three substrates was conducted at a temperature of about 190 degrees C. and a corresponding pressure of about 500 p.s.i. The resulting structure, in one example of the invention, possessed an overall thickness of only about 20 mils to about 50 mils. It may also possess width and length dimension similar to those described for the individual substrates defined above, this resulting structure being a combination of same aligned in a vertical orientation.

Although it is shown in FIG. 7 that the conductive thru-holes are not physically coupled to one or both of the interim conductive layers 33', it is possible that this be accomplished, e.g., should the interim conductive layer function as a ground and it is desired to ground one or more of these thru-holes and the remaining conductive element (e.g., a signal line) which is electrically coupled thereto.

Thus there has been shown and described a new and unique apparatus for making a circuitized substrate in which the substrate is formed during a continuous process in which the substrate's conductive layer remains a solid sheet (except when defined patterns of holes or openings are provided therein) throughout the entire operation. Additional conductive layers are also possible. Significantly, the final structures are provided during which precise hole formation is possible in addition to other precise operations such as circuit pattern formation and the like. This method, and the defined apparatus for accomplishing same, thus represents a significant advancement in the art.

While there have been shown and described what are at present the preferred embodiments of the invention, it will be obvious to those skilled in the art that various changes and modifications may be made therein without departing from the scope of the invention as defined by the appended claims.

What is claimed is:

1. An apparatus for making a plurality of circuitized substrates, said apparatus comprising:
    a first feed device for feeding a first conductive layer having first and second opposing surfaces;
    second and third feed devices for feeding first and second dielectric layers;
    a bonding device for bonding said first and second dielectric layers to said first and second opposing surfaces of said first conductive layer, respectively, to form a continuous, bonded structure;
    a hole-forming device for forming holes within said continuous, bonded structure in a plurality of patterns such that said holes extend entirely through the thickness of said structure;
    a metal depositing device for depositing electrically conductive material within said holes; and
    a segmenting device for segmenting said continuous bonded structure to define a plurality of circuitized substrates each having a respective one of said patterns of holes therein, all of said devices adapted for performing the above respective processes while said first conductive layer is in the form of a continuous, solid member.

2. The apparatus of claim 1 wherein each of said first, second and third feed devices comprises a feed roller having a respective one of said layers thereon.

3. The apparatus of claim 1 wherein said bonding device for bonding said first and second dielectric layers to said first and second opposing surfaces of said first conductive layer, respectively, to form a continuous, bonded structure comprises a pair of opposed, heated rollers, each of said opposed, heated rollers engaging a respective one of said first and second dielectric layers as said first and second dielectric layers and said first conductive layer pass between said pair of opposed, heated rollers.

4. The apparatus of claim 1 wherein said metal depositing device comprises a plater.

5. The apparatus of claim 1 wherein said segmenting device comprises a shear mechanism.

6. The apparatus of claim 1 further including a device for bonding third and fourth dielectric layers each having a conductive layer thereon to said first and second dielectric layers following said bonding of said first and second dielectric layers to said first and second opposing surfaces of said first conductive layer respectively, to form a continuous, bonded structure, and prior to said forming of said holes within said continuous, bonded structure in a plurality of patterns such that said holes extend entirely through the thickness of said structure, said hole-forming device also forming said holes within said third and fourth dielectric layers and said conductive layers thereon.

7. The apparatus of claim 1 wherein said metal depositing device comprises an electronic paste deposition device.

8. The apparatus of claim 7 further including a device for bonding third and fourth dielectric layers each having a conductive layer thereon to said first and second dielectric layers following said bonding of said first and second dielectric layers to said first and second opposing surfaces of said first conductive layer respectively, to form a continuous, bonded structure, and prior to said forming of said holes within said continuous, bonded structure in a plurality of patterns such that said holes extend entirely through the thickness of said structure, said hole-forming device also forming said holes within said third and fourth dielectric layers and said conductive layers thereon.

9. The apparatus of claim 1 wherein said hole-forming device for forming said holes within said continuous, bonded structure in a plurality of patterns such that said holes extend entirely through the thickness of said structure is selected from the group of devices consisting of mechanical drills, punching apparatus, and a laser.

10. The apparatus of claim 9 wherein said hole-forming device comprises a laser, said laser being a UV-YAG laser.

* * * * *